United States Patent [19]

Morishita et al.

[11] Patent Number: 4,583,036
[45] Date of Patent: Apr. 15, 1986

[54] CHARGING SYSTEM DIAGNOSTIC DEVICE

[75] Inventors: Mitsuharu Morishita; Shinichi Kouge, both of Hyogo, Japan

[73] Assignee: Mitsubishi Denki Kabushiki Kaisha, Japan

[21] Appl. No.: 771,157

[22] Filed: Aug. 30, 1985

Related U.S. Application Data

[63] Continuation of Ser. No. 503,460, Jun. 13, 1983, abandoned.

[30] Foreign Application Priority Data

Jun. 11, 1982 [JP] Japan ................................ 57-101016
Jun. 19, 1982 [JP] Japan ................................ 57-106406
Jun. 19, 1982 [JP] Japan ................................ 57-106407

[51] Int. Cl.$^4$ ............................................. H02J 7/14
[52] U.S. Cl. .......................................... 320/39; 320/48
[58] Field of Search ............................. 320/39, 48, 59

[56] References Cited

U.S. PATENT DOCUMENTS 4,308,492 12/1981 Mori et al. ............................ 320/39

FOREIGN PATENT DOCUMENTS 2028117 11/1975 Fed. Rep. of Germany .
3031931 2/1982 Fed. Rep. of Germany .
3036971 5/1982 Fed. Rep. of Germany ........ 320/41
8103401 11/1981 PCT Int'l Appl. .

Primary Examiner—Patrick R. Salce
Assistant Examiner—Anita M. Ault
Attorney, Agent, or Firm—Sughrue, Mion, Zinn, Macpeak, and Seas

[57] ABSTRACT

A diagnostic system for a charging system includes a microcomputer made integral with the generator and which receives and processes data from plural points in the system to diagnose system faults. Various sensors such as current detectors and a battery electrolyte testing sensor may be used to input data to the microcomputer for processing.

4 Claims, 5 Drawing Figures

CHARGING SYSTEM DIAGNOSTIC DEVICE

This is a continuation of application Ser. No. 503,460, filed 6/13/83 now abandoned.

BACKGROUND OF THE INVENTION

This invention relates to a diagnostic device in which data representative of the conditions of various parts of the charging system of a vehicle are inputted with a predetermined period (sampling frequency), so as to monitor the operating conditions of the various parts, to diagnose whether these parts are normal and to display the results of such diagnosis.

A charging system of this type is arranged as shown in FIG. 1. In FIG. 1, reference numeral 1 designates a generator having an armature 1a and a field coil 1b; 2, a rectifier for rectifying the output of the generator 1, i.e., the three-phase AC outputs of the armature 1a; 3, a voltage regulator for regulating the generated voltage of the generator 1, the voltage regulator 3 having a voltage detecting terminal a, a terminal b connected to the field coil 1b, for allowing a controlled field current, a grounding terminal c which also supplies a current for initially exciting the generator 1; 4, an ordinary battery containing electrolyte; 5, a key switch which is closed to start the internal combustion engine (not shown); and 6, a pilot lamp connected between the terminals a and d, the pilot lamp 6 being turned on or off according to the difference between the voltages at the terminals a and d. The voltage regulator comprises diodes 306 and 314; transistors 307 and 308; resistors 309, 311, 312 and 313; a comparator 310 and a reference voltage source 315.

When the key switch 5 is turned on, a starter (not shown) starts the internal combustion engine, so that the armature 1a of the generator 1 is rotated. While the speed of the armature 1a is low, the initial field current flows from the battery 4 through the key switch 5, the terminal d of the voltage regulator 3, the diode 314, the resistor 313, the terminal a, the field coil 1b, the terminal b, the transistor 307 and the terminal c to ground, so that the pilot lamp 6 is turned on by the difference between the voltage at the terminals a and d. As the speed of the armature 1a increases, the generated voltage of the armature 1a is increased and the voltage at the terminal a is increased, so that the difference between the voltages at the terminals a and d is decreased and accordingly the pilot lamp 6 is turned off. As the voltage at the terminal a is increased, the voltage at one input terminal of the comparator 310, which is determined by the voltage division ratio of the resistors 311 and 312, is also increased. When this voltage exceeds the reference voltage provided by the reference voltage source 315, the state of the output of the comparator 310 is changed. As a result, the transistor 307 which has been maintained conductive by the output is rendered non-conductive. Therefore, the transistor 307 is turned off, i.e., the terminal b is electrically disconnected from the terminal c, so that the flow of field current to the field coil 1b is stopped. When, in contrast, the voltage at the terminal a is decreased, the transistor 307 is rendered conductive, so that the field current flows again. The above-described operation is repeatedly carried out, to regulate the output voltage of the generator 2. The pilot lamp 6 is turned on only when the voltage at the terminal a is lower than a predetermined value, and it is turned off when the generator is normally generating electricity, thus indicating the generation condition.

However, it is impossible for this display method to monitor whether or not the charging system comprising the generator, the full-wave rectifier, the voltage regulator, the battery, etc. is in an abnormal state. That is, the method cannot indicate, for instance, that the battery cannot be charged because it is electrically disconnected from the rectifier, that the generator is not working because the exciting circuit is out of order, that control is not suitably carried out, or that the diodes for charging the battery are defective. Likewise, this system cannot monitor the charging condition of the battery. When the charging system is out of order, this method cannot determine what the trouble is.

SUMMARY OF THE INVENTION

Accordingly, an object of this invention is to eliminate the above-described difficulties accompanying a conventional charging system diagnostic device. More specifically, an object of the invention is to provide a charging system diagnostic device in which the condition at various points in the charging system, the terminal voltage of the battery, the charge and discharge current of the battery and at least one of the electrochemical conditions of the battery are periodically read and are processed to diagnose the charging system, and wherein the results of the diagnosis thus made are displayed, so that the charging system is readily controlled and faults therein are indicated.

DETAILED DESCRIPTION OF THE PREFERRED EMBODIMENTS

Figure 1:
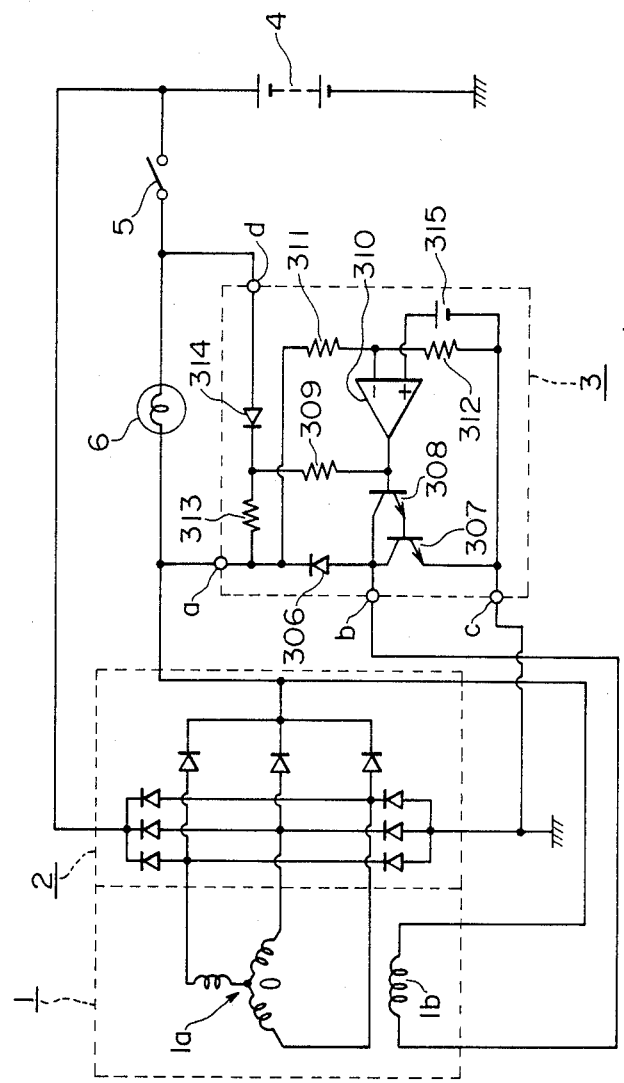
FIG. 1 is a circuit diagram showing a conventional vehicular charging system.
Figure 2:
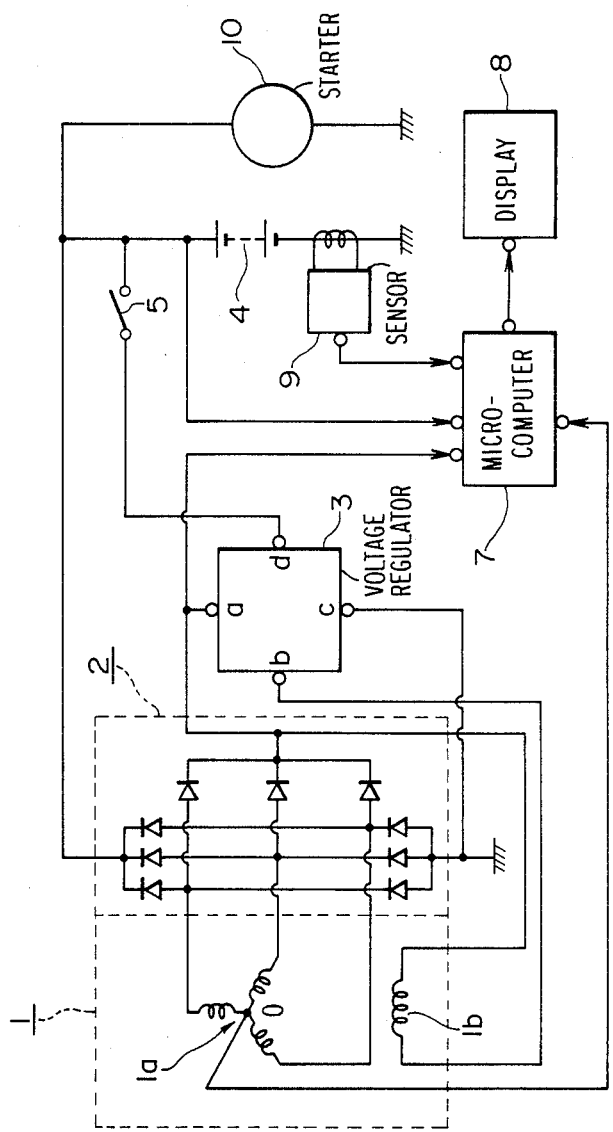
FIG. 2 is a block diagram illustrating one example of a charging system control device according to this invention.

FIG. 2 is a block diagram showing one example of a charging system diagnostic device according to this invention. In FIG. 2, those parts which have been described previously with reference to FIG. 1 are designated by the same reference numerals or characters, unless otherwise specified. In FIG. 2, reference numeral 3 designates a voltage regulator which is illustrated in detail in FIG. 3; and 7, a charging-system controlling microcomputer having a multiplexer for multiplexing analog level input signals, an analog-to-digital converter for digitally converting the output of the multiplexer, a central processing unit for periodically storing the output of the converter with a predetermined period, to carry out diagnosis according to a predetermined diagnosing program, and a memory in which the diagnosing program and processing data have been stored. In order to economically utilize the available space, it is practical to build the microcomputer into the generator 1 or to install it on the generator. Further in FIG. 2, reference numeral 8 designates a display unit for displaying the results of diagnosis outputted by the control section 7; 9, a sensor for detecting the current flowing through the negative terminal of the battery 4, to supply a signal to the microcomputer 7; and 10, a starter for the internal combustion engine.

The operation of the charging system diagnostic device thus organized will now be described.

The microcomputer 7 reads the voltage at the terminal a of the voltage regulator 3, the output signal of the sensor 9 and the voltage at the neutral point O of the armature 1a with a predetermined period, to execute the diagnosing program thereby to diagnose the charging system as follows:

(a) When the key switch 5 is turned on to start the internal combustion engine, if the voltage (for instance lower than 11 V) at the positive terminal of the battery 4 and the output signal of the sensor 9 are not up to predetermined values, it is determined that the battery 4 has been overdischarged.

(b) When the key switch 5 is turned on to start the internal combustion engine, if the voltage of the battery 4 and the output signal of the sensor 9 reach their predetermined values but the voltage of the neutral point O of the armature 1a does not reach a predetermined value, it is determined that the generator is not working. For instance, when, with the speed of the engine being higher than 800 r.p.m., the produced voltage is lower than 10 V for at least five seconds, it is determined that the generator is not working.

(c) When, at the start of the engine, the voltage of the battery 4 is greatly decreased and the signal of the sensor 9 does not reach its predetermined value, it is determined that the internal resistance of the battery 4 is high and the battery is no longer serviceable. For instance, when the internal resistance of the battery, which is calculated from the voltage and current of the battery, is at least 1.5 times as high as the rated internal resistance, it is determined that the battery should be replaced.

In addition, other conditions of the charging system may be determined from the condition data supplied to the control section 7.

These results of diagnosis are applied to the display unit 8, where they are displayed. Examples of the display unit 8 are an acoustic means, a lamp on the instrument panel of the vehicle, a liquid crystal display, and a cathode ray tube.

In the above-described device, the data at four points in the charging system are inputted to the microcomputer. However, the device may be modified so that the voltages and currents at other points and the electrochemical conditions of the battery are read so that the charging system may be diagnosed more accurately.

Figure 3:
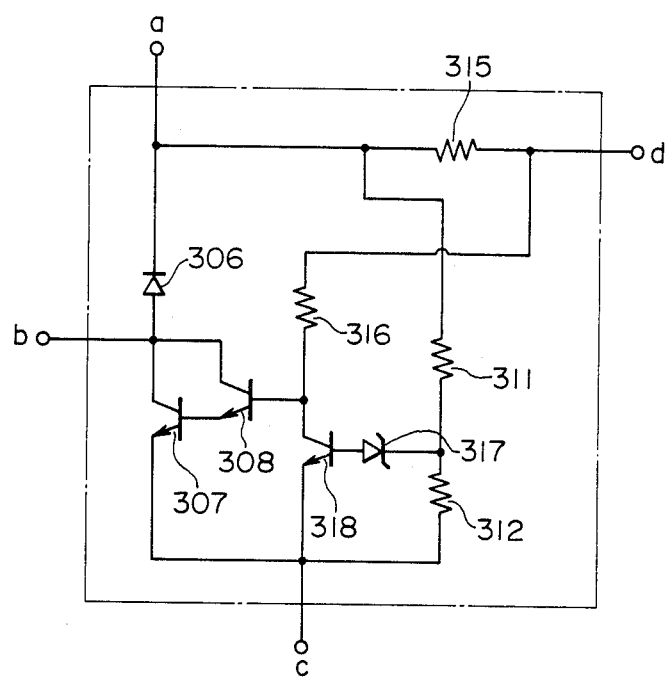
FIG. 3 is a circuit diagram illustrating the details of the voltage regulator of FIG. 2.

The operation of the voltage regulator illustrated in FIG. 3 now will be described. When the keyswitch 5 is closed, current flows from the battery 4 through the keyswitch 5, to the terminal d of the voltage regulator, through the resistor 315, the terminal a, the field coil 1b, the terminal b, transistor 307, to the terminal c, and then to ground.

When the voltage at the terminal a increases, the voltage divided output of resistors 311 and 312 increases, causing a transistor 318, whose switching operation is blocked by Zener diode 317, to become conductive, thereby rendering the transistor 307 nonconductive. The amount of voltage required to cause the transistor 318 to become conductive is determined by the zener diode 317, in a manner similar to the function of the reference voltage generator 315 of the prior art voltage regulator, the reference voltage passing to the non-inverting input of comparator 310, to determine conductivity of the transistor 307 in a similar manner.

As stated above, the simpler voltage regulator of the subject invention has improved surge voltage characteristics and is more easily constructed than is the voltage regulator shown in FIG. 1.

Figure 4:
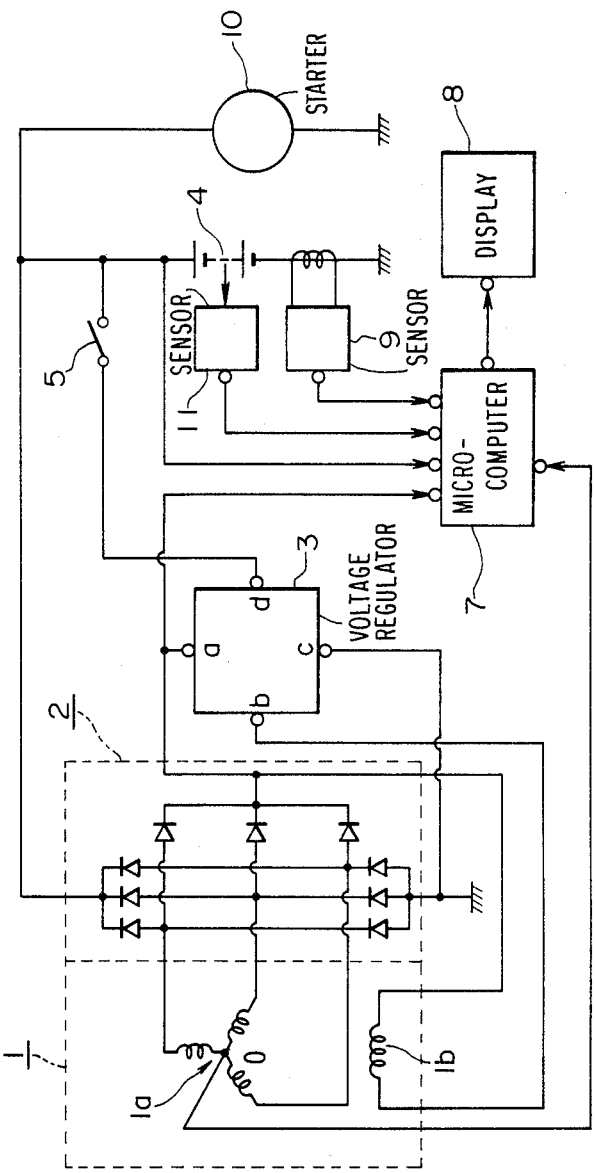
FIGS. 4 and 5 are diagrams illustrating modifications of the embodiment of FIGS. 2 and 3.

For example, a charging system diagnostic device may be provided, in which, in addition to the input means coupled to the microcomputer 7 as shown in FIG. 2, a second sensor 11 for detecting an electrochemical condition of the battery 4 such as the specific gravity of the electrolyte therein is provided as shown in FIG. 4. The output of the second sensor 11 is also utilized to diagnose the charging system. With this device, the charging system is diagnosed as follows:

(a) If, when the key switch 5 is turned on, the voltage at the positive terminal of the battery 4 and the output signal of the sensor 11 do not reach predetermined values, it is determined that the battery has been overdischarged. In this case, for instance the terminal voltage is lower than 11 V and the specific gravity is less than 1.1.

(b) If, when the key switch 5 is turned on to start the internal combustion engine, the output signals of the sensors 9 and 11 and the voltage at the terminal a of the voltage regulator 3 reach their predetermined values but the voltage at the neutral point O of the armature 1a does not reach a predetermined value, it is determined that the generator is not working. For instance, when, with the speed of the engine higher than 800 r.p.m., the produced voltage is maintained lower than 10 V for at least five seconds, a fault is indicated similarly as in the case of the device shown in FIG. 2.

(c) Upon starting the engine, if the voltage of the battery 4 is greatly decreased and the signals of the sensors 9 and 11 do not reach their predetermined values, it is determined that the battery is no longer serviceable. For instance when the internal resistance of the battery calculated from the output of the sensor 9 is at least 1.5 times as high as the rated internal resistance, it is determined that the battery is no longer serviceable.

Figure 5:
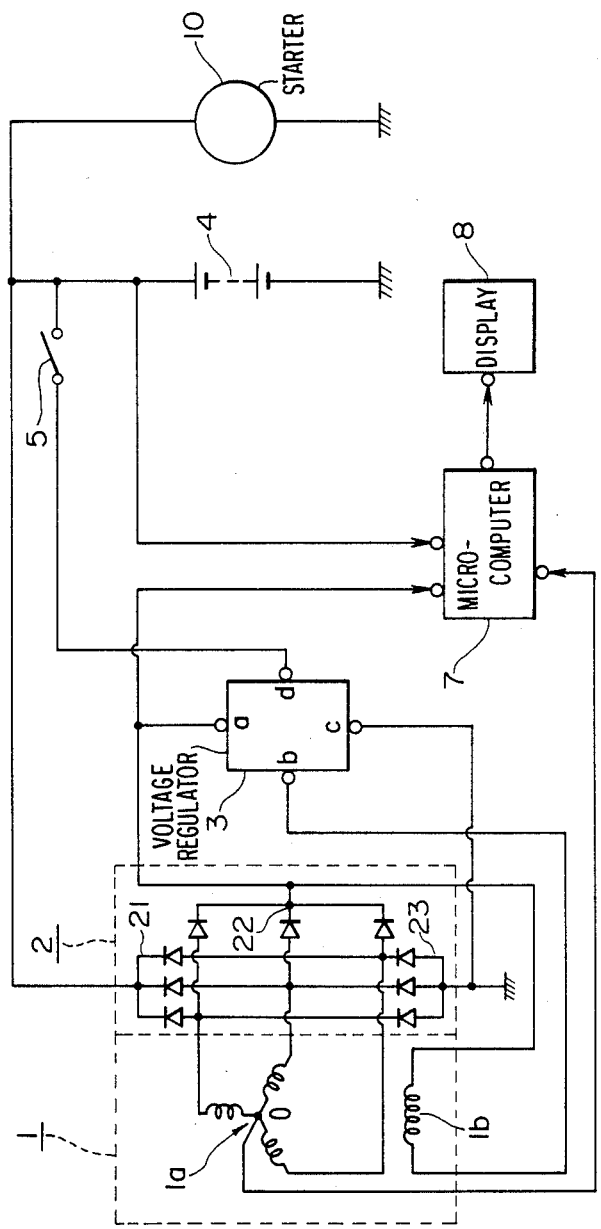

In the examples of the charging system diagnostic device of FIGS. 2 and 4, at least one sensor is provided in order to obtain a part of the condition data of the charging system. However, in the case where it is required to detect only those faults such that the generator does not generate electricity, the output voltage is not regulated, and the battery is electrically disconnected from the rectifier, another example of the device as shown in FIG. 5 may be employed. With this device, the charging system is diagnosed, for instance, as follows:

(a) If the produced voltage is maintained lower than 10 V for at least five seconds with the engine normally operated, it is determined that the generator is not working.

(b) If the produced voltage is maintained higher than 16 V for at least six seconds with the engine normally operated, it is determined that the regulator is not working.

(c) If the difference between the produced voltage and the battery voltage is maintained higher than 1.5 V for at least five seconds, it is determined that the charging system is out of order because the battery is electrically disconnected from the output terminal of the rectifier.

In the device shown in FIG. 5, the produced voltage and the voltage at the neutral point of the armature are utilized; however, the voltage at the second rectifier output terminal 22 and the voltage at one phase output terminal of the armature may be utilized.

As is apparent from the above description, according to the invention, condition data at the plural points of the charging system are inputted into the microcomputer at a predetermined frequency, and the present values and variations with time of these data are utilized to monitor the charging system. Accordingly, when a fault occurs in the charging system, its symptoms and location can be accurately detected. Therefore, according to the invention, the occurrence of faults in the charging system can be detected, and the charging system can be readily controlled. Since the microcomputer is made integral with the generator, the available space can be efficiently utilized. This should be appreciated in practical use.

What is claimed is:

1. In a charging system diagnostic device comprising:
   a generator driven by an engine;
   a rectifier, having first and second output terminals, for rectifying the output of the generator;
   a voltage regulator for controlling the generator so that its output has a predetermined value;
   a battery which is charged by the output of the rectifier;
   means, connected to said battery, for monitoring charge and discharge currents of said battery;
   a charging system diagnostic microcomputer for reading, at a predetermined frequency, at least data representing a terminal voltage of said battery, data representing a generated voltage of said generator, and data representing charge and discharge currents of said battery, to diagnose said charging system; and
   a display unit for displaying the results of the diagnosis made by said microcomputer;
   the improvement wherein said voltage regulator comprises:
   a first regulator terminal connected to said second output terminal of said rectifier;
   a second regulator terminal connected to a field coil;
   a third regulator terminal connected to an input terminal of said rectifier;
   a fourth regulator terminal connected to said second output terminal of said rectifier and to a positive terminal of said battery;
   a voltage divider comprising first and second resistors serially connected, one end of said voltage divider being connected to said first regulator terminal, the other end being connected to said third regulator terminal;
   a Zener diode having one end connected to a junction point between said first and second resistors;
   a first transistor having a base connected to the other end of said Zener diode and an emitter connected to said third regulator terminal;
   a third resistor having one end connected to said fourth regulator terminal and the other end connected to a collector of said first transistor;
   a second transistor having a base connected to a collector of said first transistor and a collector connected to said second regulator terminal;
   a third transistor having a base connected to an emitter of said second transistor, an emitter connected to said third regulator terminal, and a collector connected to said second regulator terminal; and
   a diode having one end connected to said second regulator terminal and to said collectors of said second and third transistors, and the other end connected to said first regulator terminal.

2. A device as claimed in claim 1, in which said microcomputer is integral with said generator.

3. A device as claimed in claim 2, said microcomputer being built into said generator.

4. A device as claimed in claim 1, further including at least one sensor for outputting data representing an electrochemical condition of said battery to said microcomputer.

* * * * *